(12) United States Patent
Jun

(10) Patent No.: US 10,732,874 B2
(45) Date of Patent: Aug. 4, 2020

(54) MEMORY SYSTEM AND OPERATION METHOD THEREOF

(71) Applicant: SK hynix Inc., Gyeonggi-do (KR)

(72) Inventor: Jang-Hwan Jun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 44 days.

(21) Appl. No.: 16/223,768

(22) Filed: Dec. 18, 2018

(65) Prior Publication Data

US 2019/0354288 A1 Nov. 21, 2019

(30) Foreign Application Priority Data

May 15, 2018 (KR) ........................ 10-2018-0055181

(51) Int. Cl.
G06F 12/00 (2006.01)
G06F 3/06 (2006.01)
G11C 16/16 (2006.01)

(52) U.S. Cl.
CPC ............ *G06F 3/064* (2013.01); *G06F 3/0625* (2013.01); *G06F 3/0652* (2013.01); *G06F 3/0658* (2013.01); *G06F 3/0659* (2013.01); *G06F 3/0688* (2013.01); *G11C 16/16* (2013.01)

(58) Field of Classification Search
None
See application file for complete search history.

(56) References Cited

U.S. PATENT DOCUMENTS

| | | | | |
|---|---|---|---|---|
| 10,020,061 B2* | 7/2018 | Lee | ........................ | G06F 3/0625 |
| 10,126,978 B2* | 11/2018 | You | ........................ | G11C 16/16 |
| 10,157,007 B2* | 12/2018 | Byun | .................... | G06F 3/0604 |
| 2015/0070996 A1* | 3/2015 | Kim | ........................ | G11C 16/10 |
| | | | | 365/185.12 |
| 2015/0113237 A1* | 4/2015 | Kim | ........................ | G11C 8/06 |
| | | | | 711/162 |
| 2016/0274808 A1* | 9/2016 | Zhang | .................... | G06F 3/0619 |
| 2017/0169883 A1* | 6/2017 | Kwon | ........................ | G11C 7/14 |
| 2017/0337972 A1* | 11/2017 | Lee | ........................ | G11C 16/16 |
| 2018/0018111 A1* | 1/2018 | Byun | .................... | G06F 3/0604 |
| 2018/0336104 A1* | 11/2018 | Koo | .................... | G06F 11/1417 |
| 2019/0056887 A1* | 2/2019 | Park | .................... | G11C 11/5628 |
| 2019/0196960 A1* | 6/2019 | Lin | ........................ | G06F 11/07 |
| 2019/0205247 A1* | 7/2019 | Lin | ........................ | G06F 3/0679 |
| 2019/0213079 A1* | 7/2019 | Kim | .................... | G06F 11/1441 |
| 2019/0236005 A1* | 8/2019 | Lee | .................... | G06F 11/1417 |
| 2019/0259457 A1* | 8/2019 | Jun | ........................ | G11C 16/10 |
| 2019/0310923 A1* | 10/2019 | Jun | ........................ | G06F 3/0604 |
| 2020/0050515 A1* | 2/2020 | Gim | .................... | G06F 11/1417 |
| 2020/0075114 A1* | 3/2020 | Lin | ........................ | G11C 16/16 |

FOREIGN PATENT DOCUMENTS

| | | |
|---|---|---|
| KR | 1020170130657 | 11/2017 |
| KR | 1020180008951 | 1/2018 |

* cited by examiner

*Primary Examiner* — John A Lane
(74) *Attorney, Agent, or Firm* — IP & T Group LLP

(57) ABSTRACT

A method for operating a memory system includes: detecting a first erase page of a super block, which is formed of memory blocks, by scanning the super block according to a binary search scheme based on a program order in which pages in the super block are programmed; and performing a Sudden Power Off Recovery (SPOR) based on the detected first erase page.

11 Claims, 13 Drawing Sheets

FIG. 6B

| Block-Page | Page |
|---|---|
| 0-0 | 0 |
| 1-0 | 1 |
| 2-0 | 2 |
| 3-0 | 3 |
| 0-1 | 4 |
| 1-1 | 5 |
| 2-1 | 6 |
| 3-1 | 7 |
| ... | ... |
| 0-4 | 16 |
| 1-4 | 17 |
| 2-4 | 18 |
| 3-4 | 19 |
| 0-5 | 20 |
| 1-5 | 21 |
| 2-5 | 22 |
| 3-5 | 23 |
| 0-6 | 24 |
| 1-6 | 25 |
| 2-6 | 26 |
| 3-6 | 27 |
| 0-7 | 28 |
| 1-7 | 29 |
| 2-7 | 30 |
| 3-7 | 31 |
| 0-8 | 32 |
| ... | ... |
| 0-15 | 60 |
| 1-15 | 61 |
| 2-15 | 62 |
| 3-15 | 63 |

MEMORY SYSTEM AND OPERATION METHOD THEREOF

CROSS-REFERENCE TO RELATED APPLICATIONS

The present application claims priority under 35 U.S.C. § 119(a) to Korean Patent Application No. 10-2018-0055181, filed on May 15, 2018, which is incorporated herein by reference in its entirety.

BACKGROUND

1. Field

Various embodiments of the present invention relate to a memory system, and more particularly, to a memory system and a method for operating the memory system.

2. Description of the Related Art

The emerging computer environment paradigm is ubiquitous computing, that is, computing systems that can be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory device or an auxiliary memory device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Embodiments of the present invention are directed to a memory system capable of quickly detecting a first erase page of an open memory block therein, and an operating method of such memory system.

In accordance with an embodiment of the present invention, a method for operating a memory system includes: detecting a first erase page of a super block, which is formed of memory blocks, by scanning the super block according to a binary search scheme based on a program order in which pages in the super block are programmed; and performing a Sudden Power Off Recovery (SPOR) based on the detected first erase page.

In accordance with another embodiment of the present invention, a memory system includes: a memory device; and a controller suitable for controlling the memory device, wherein the controller detects a first erase page of a super block, which is formed of memory blocks, by scanning the super block according to a binary search scheme based on a program order in which pages in the super block are programmed, and performs an SPOR based on the detected first erase page.

In accordance with another embodiment of the present invention, a memory system includes: a memory device including a super block having two or more memory blocks each configured by pages; and a controller configured to: control the memory device to perform a program operation to the super block according to an interleaved program order of the pages among the memory blocks; detect a global first erased page among the pages according to a linear search scheme for the interleaved program order; detect, based on the global first erased page, local first erased pages of the respective memory blocks according to the interleaved program order; and control the memory device to perform a sudden power off recovery operation to the memory blocks according to the interleaved program order and the local first erased pages.

BRIEF DESCRIPTION OF THE DRAWINGS

FIG. 6B illustrates a table for defining relationship between pages of FIG. 5 and pages of FIG. 6A.

DETAILED DESCRIPTION

Figure 1:
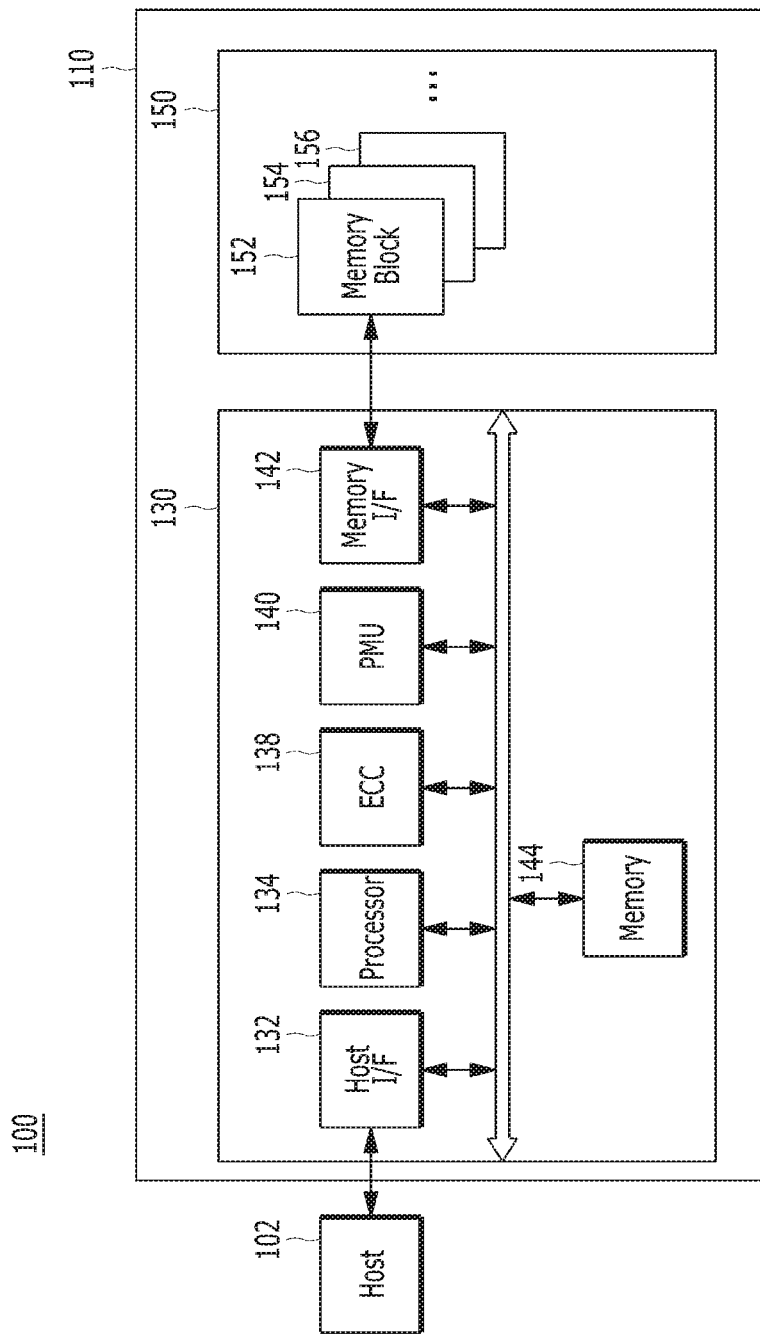
FIG. 1 is a block diagram illustrating a data processing system in accordance with an embodiment of the present invention.

Exemplary embodiments of the present invention will be described below in more detail with reference to the accompanying drawings. Elements and features of the present invention may, however, be embodied in different ways. Thus, the present invention is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase are not necessarily to the same embodiment(s).

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, game machine, TV, and projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and/or micro-MMC. The SD card may include a mini-SD card and/or micro-SD card.

The memory system 110 may be embodied by any of various types of storage devices. Examples of such storage devices include, but are not limited to, volatile memory devices such as a DRAM dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in any of the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device that retains data stored therein even though power is not supplied. The memory device 150 may store data provided from the host 102 through a write operation, and provide data stored therein to the host 102 through a read operation. The memory device 150 may include a plurality of memory blocks 152, 154, 156, each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144, all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may instead output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for suitable error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 exemplifies the memory 144 disposed within the controller 130. In another embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134. The background operation performed onto the memory device 150 may include an operation of copying and processing data stored in some memory blocks, among the memory blocks 152 to 156 of the memory device 150, into other memory blocks, e.g., a garbage collection (GC) operation, an operation of swapping data between the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
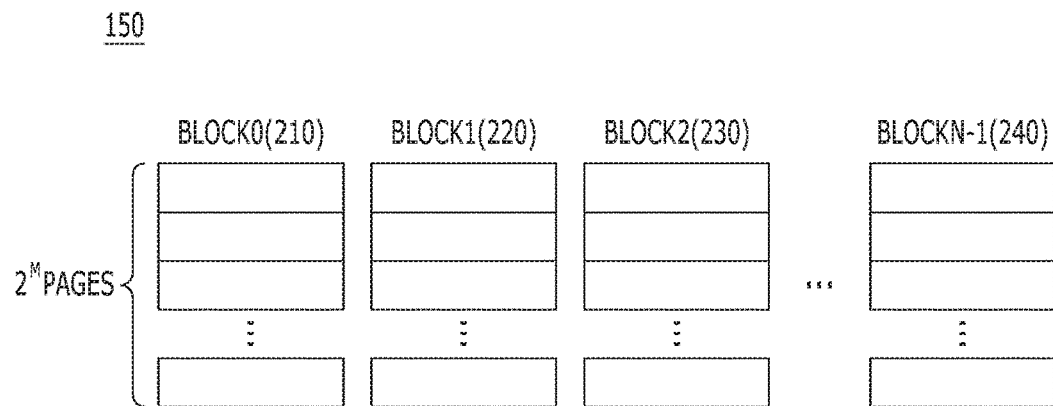
FIG. 2 is a schematic diagram illustrating an exemplary configuration of a memory device employed in a memory system of FIG. 1.
Figure 3:
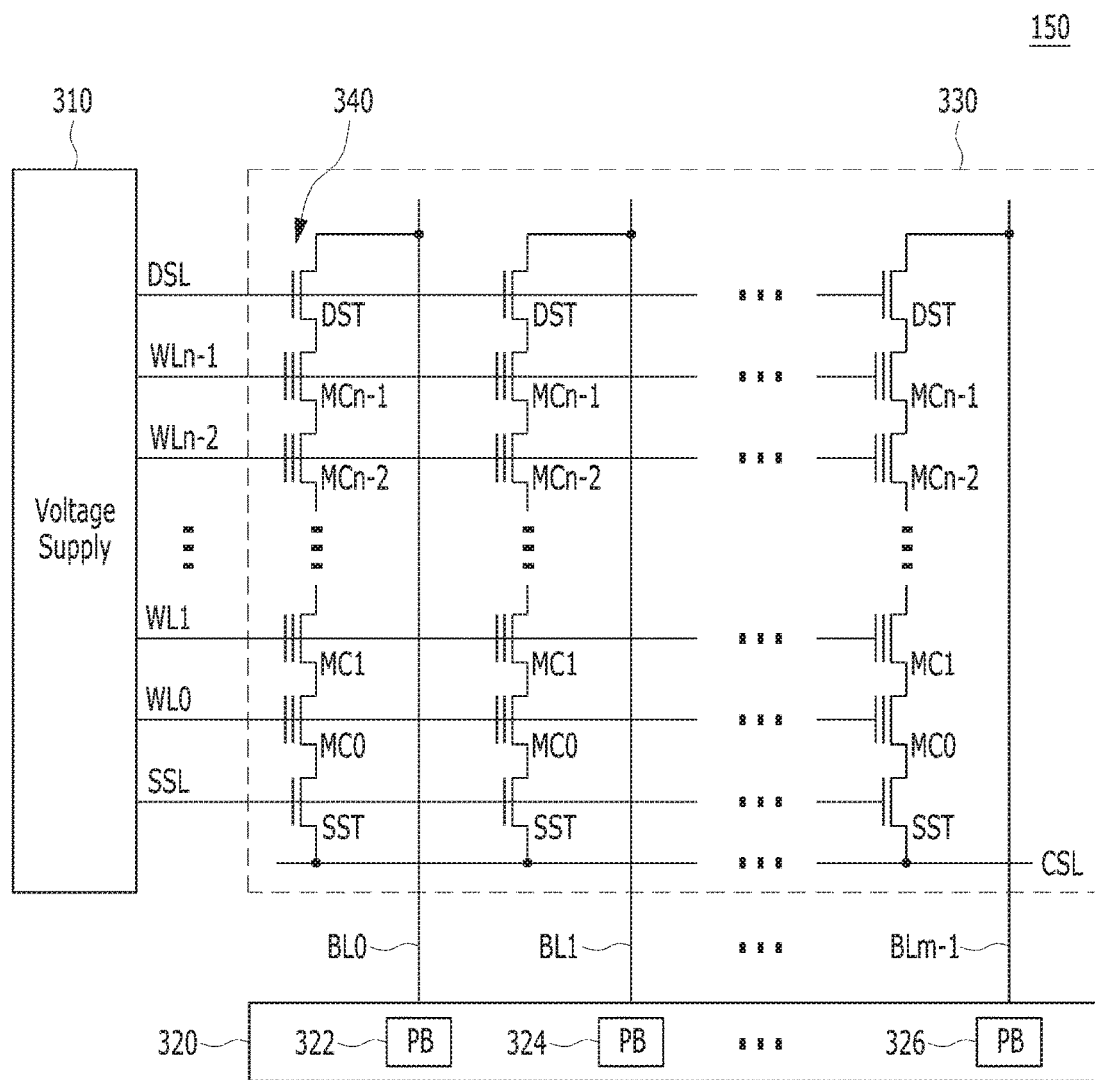
FIG. 3 is a circuit diagram illustrating an exemplary configuration of a memory cell array of a memory block in a memory device shown in FIG. 1.
Figure 4:
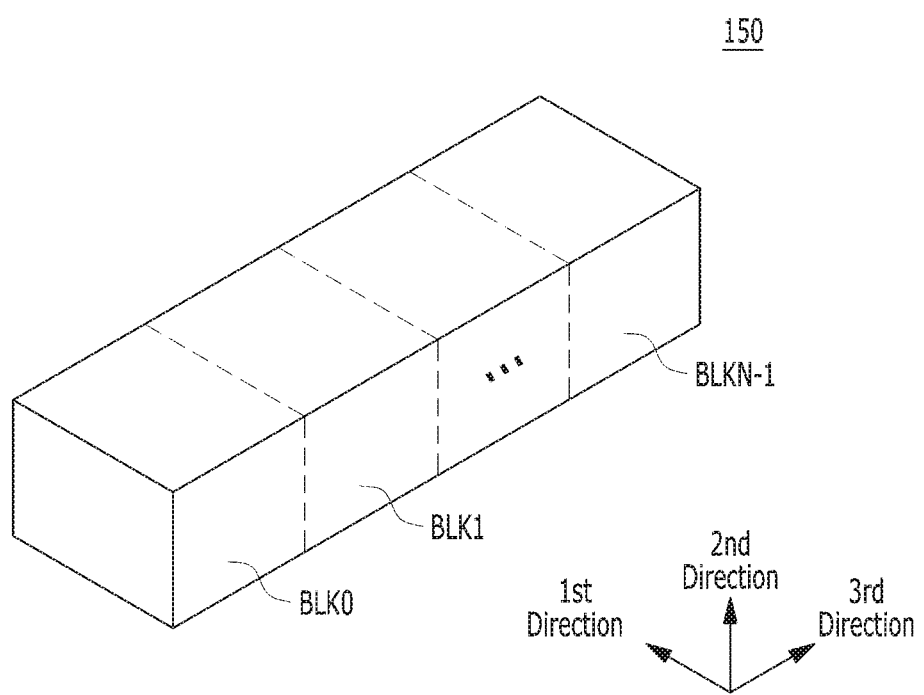
FIG. 4 is a schematic diagram illustrating an exemplary three-dimensional (3D) structure of the memory device of FIG. 2.

FIG. 2 is a schematic diagram illustrating the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks 0 to N−1, e.g., a memory block 0 (BLK0) 210, a memory block 1 (BLK1) 220, a memory block 2 (BLK2) 230, and a memory block N−1 (BLKN−1) 240. Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block storing 1-bit data per cell and/or a multi-level cell (MLC) memory block storing 2-bit data per cell. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or higher-multiple level cell memory blocks each of which includes a plurality of pages that are realized by memory cells capable of storing five or more-bit data in one memory cell.

In accordance with an embodiment of the present invention, the memory device 150 is a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks 210, 220, 230 and 240 may store the data transferred from the host 102 through a program operation, and transfer data stored therein to the host 102 through a read operation.

Referring to FIG. 3, a memory block 330 which may correspond to any of the plurality of memory blocks 152 to 156 in the memory device 150 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may be a three-dimensional structure with dimensions extending in first to third directions, e.g., an x-axis direction, a y-axis direction, and a z-axis direction.

Each memory block 330 in the memory device 150 may include a plurality of NAND strings NS that extend in the second direction, and a plurality of NAND strings NS that extend in the first direction and the third direction. Each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330, among the memory blocks 152 to 156 of the memory device 150, may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150. A data processing operation on a memory device, particularly, a data processing operation performed when a plurality of command operations corresponding to a plurality of commands are performed, in a memory system in accordance with an embodiment of the present invention is described in detail with reference to FIGS. 5 to 8.

Figure 5:
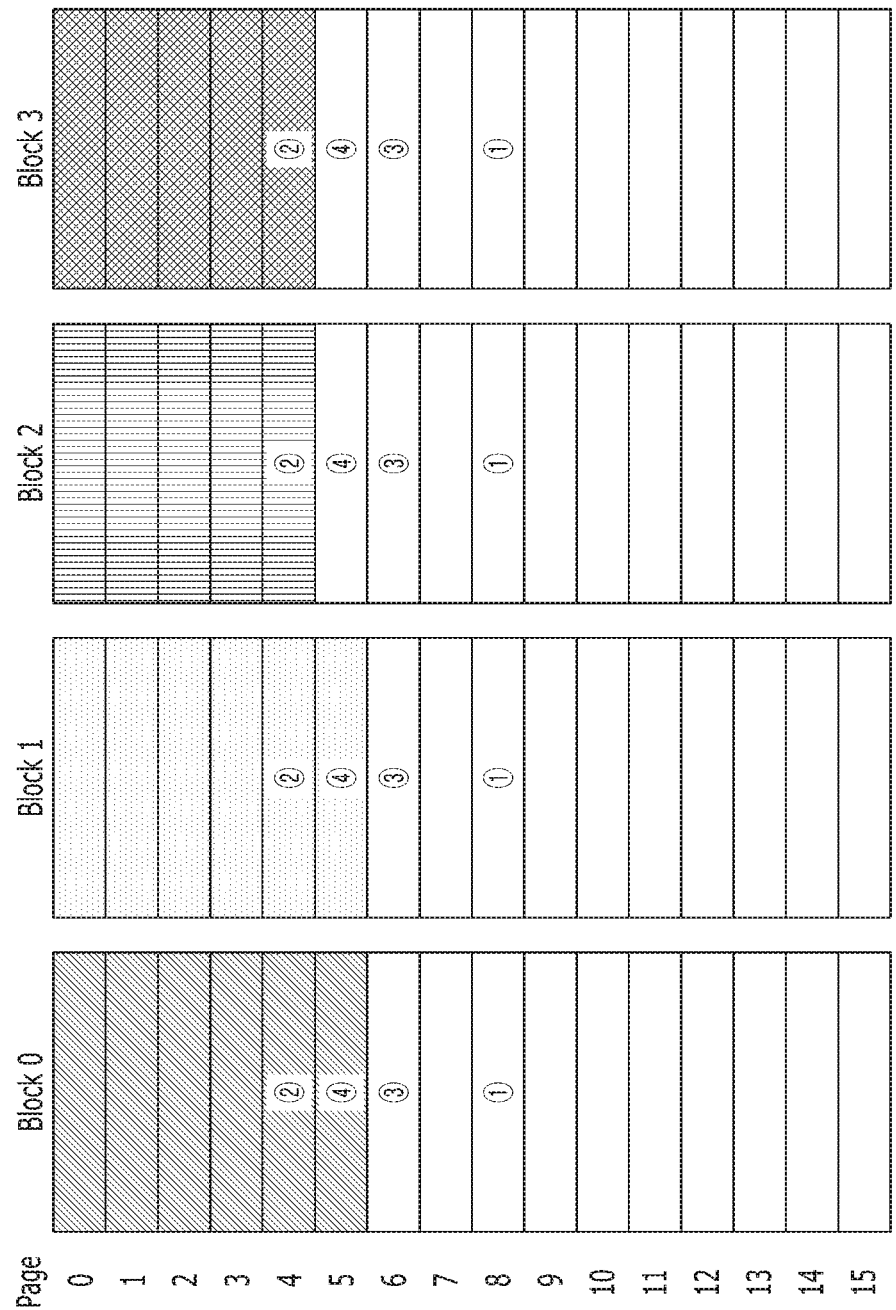
FIG. 5 illustrates memory blocks of a memory device according to prior art.

FIG. 5 exemplarily illustrates memory blocks of a memory device according to prior art.

When a memory system including the memory device is booted up after a sudden power off (SPO) occurs, the memory system performs a Sudden Power Off Recovery (SPOR).

When a SPO occurs, a program operation is interrupted in an open memory block in which the program operation was being executed at the time of the SPO. Thus, the data stored in the last programmed page of the open memory block is in an unstable state.

When the SPOR is performed, the reliability of the data stored in the last programmed page is secured by programming dummy data on the next page of the last programmed page. In this specification, the next page of the last programmed page is defined as a first erase page, and an operation of reading the pages of the open memory block to detect the first erase page is defined as open memory block scanning.

According to the prior art, a controller of the memory system performs the open memory block scanning according to a linear search scheme in which the pages are read in the reverse order in which they were programmed until the first erase page is detected in the open memory block.

According to the prior art, in order to shorten the time required for the SPOR, the controller performs the open memory block scanning according to a binary search scheme. To be specific, the controller reads a middle page disposed between a lower-most page and an upper-most page of the open memory block. If the middle page is in an erase state, the controller sets the middle page as a new upper-most page. If the middle page is in a program state, the controller sets the middle page as a new lower-most page. The controller reads a new middle page that is disposed between the new lower-most page and the new upper-most page and repeats the above operation until the new middle page converges to the first erase page.

It is well known that the time complexity of the binary search is O (log n). When the open memory block scanning according to the binary search scheme is performed on an open memory block including $2^N$ pages, it is possible to detect the first erase page by repeating the operation of reading the middle page N times at most.

According to the prior art, the controller may manage a plurality of memory blocks as a super block by grouping the memory blocks. For example, the controller may group a number of memory blocks, each of which is selected from one of multiple memory dies, and manage the memory blocks as one super block. Since each memory die is independently accessible, the performance of the memory system may be improved as the controller accesses each memory block of the super block according to an interleaving scheme.

FIG. 5 shows one super block in which memory blocks (Block 0 to Block 3), each of which includes 16 pages (Page 0 to 15), are grouped.

The controller programs the super block with data in a specific order, e.g., performing a program operation on page 0 in an ascending order among the memory blocks (Block 0 to Block 3) and then performing a program operation on page 1 in the ascending order, according to the interleaving scheme. FIG. 5 shows a situation where the SPO occurs while the super block is programmed up to Page 5 of Block 1 in the ascending order.

When the memory system is booted up after the SPO occurs, the controller performs the open memory block scanning on all the open memory blocks of the memory system to program the first erase page of each of the open memory blocks with dummy data.

Since all of the memory blocks (Block 0 to Block 3) in the super block are not programmed up to page 15, they are open memory blocks. Accordingly, the controller performs an open memory block scanning on each of the memory blocks (Block 0 to Block 3).

According to the time complexity of the binary search scheme, the first erase page of the memory block Block 0 including 16 pages is detected through four read operations. Circled numbers ① to ④ shown in the Block 0 in FIG. 5 shows the middle pages sequentially selected according to the binary search scheme. Likewise, the first erase page of each of the memory blocks (Block 1 to Block 3) is detected through every four read operations as well. That is, a total of 16 read operations may have to be performed to perform the open memory block scanning for each memory block in the super block of FIG. 5. When open memory block scanning is performed on a super block that includes $2^M$ memory blocks, each including $2^N$ pages, a total of $N \times 2^M$ read operations may have to be performed.

Moreover, more memory blocks are included in one super block according to the trend to achieve higher memory and accommodate the demand for quick access to the memory device. Accordingly, if the number of read operations according to the open memory block scanning increases, the time required for the SPOR operation may increase and the read disturbance may increase.

Figure 6A:
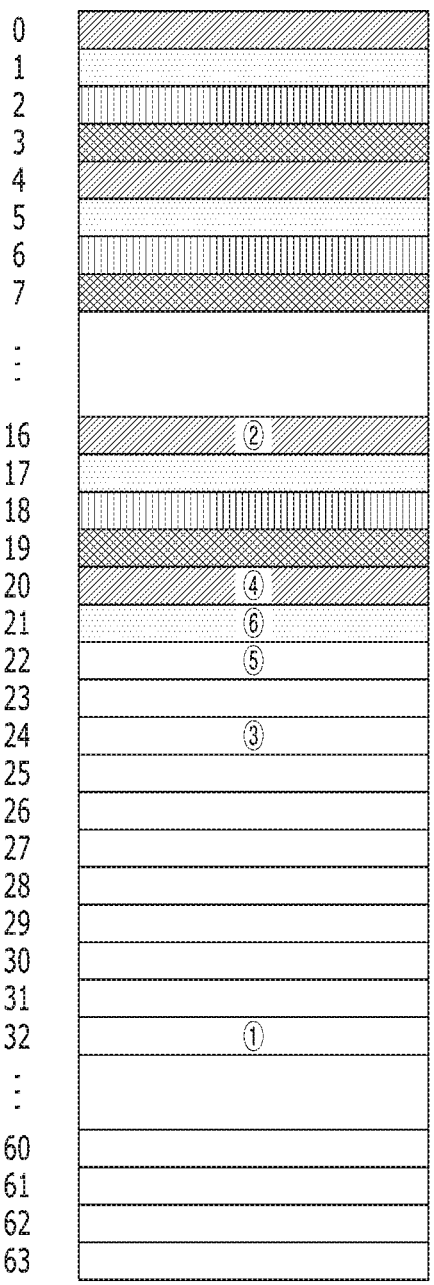
FIG. 6A illustrates pages in a super block in an order in which the pages are programmed.

FIG. 6A illustrates the pages of memory blocks that form a super block in an order in which the pages are programmed.

FIG. 6B illustrates a table for defining relationship between pages of FIG. 5 and pages of FIG. 6A.

Referring to FIG. 6B, the table may include block-page field corresponding to each of the pages of FIG. 5 and page field corresponding to each of the pages of FIG. 6A.

For example, referring to FIGS. 6A and 6B, Page 0 to Page 3 of FIG. 6A represents Page 0 of the respective memory blocks Block 0 to Block 3, and Page 4 to Page 7 of FIG. 6A represents Page 1 of the respective memory blocks Block 0 to Block 3. As described above, the memory blocks Block 0 to Block 3 are programmed according to an interleaving scheme. FIG. 6A shows 16 pages Page 0 to Page 15 of the respective memory blocks Block 0 to Block 3 programmed according to the interleaving scheme.

According to an embodiment of the present invention, all pages included in a plurality of memory blocks forming a super block may be regarded as pages included in one memory block. According to an embodiment of the present invention, the open block scanning operation may be performed on the super block, rather than on individual memory blocks, as the super block is considered, at least for this purpose, a single memory block that includes all pages of all of its constituent memory blocks. Based on this consideration, the scanning operation may be performed through a binary search scheme.

According to an embodiment of the present invention, the number of read operations performed in the open super memory block scanning operation according to the binary search scheme may be reduced. Therefore, according to an embodiment of the present invention, it is possible to prevent an increase of the read disturbance while reducing the SPOR operation time.

Figure 7:
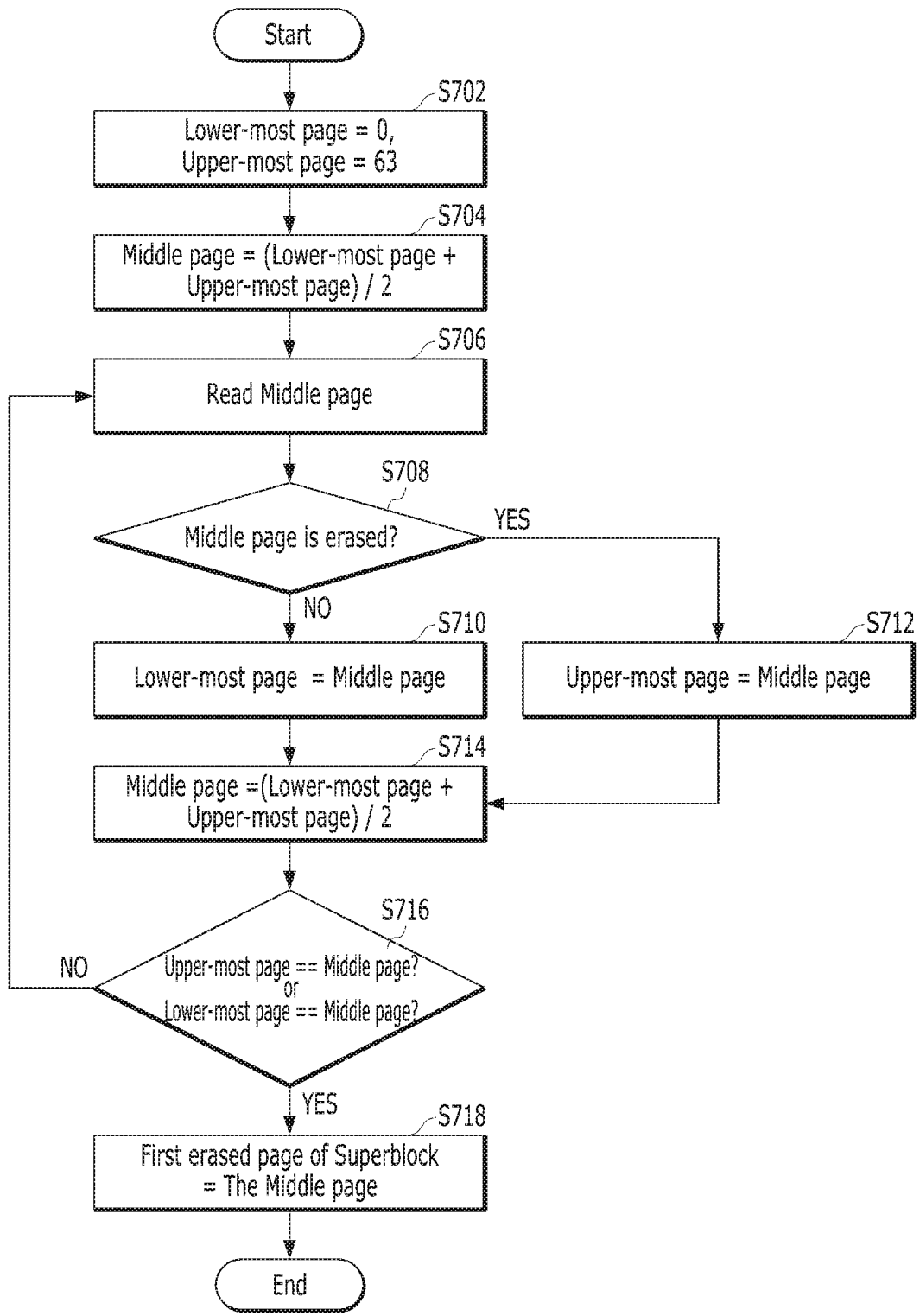
FIG. 7 is a flowchart describing scanning of an open memory block in accordance with an embodiment of the present invention.

FIG. 7 is a flowchart describing an open memory block scanning during the SPOR in accordance with an embodiment of the present invention.

In step S702, according to the order in which the pages of the super block are programmed, the controller 130 may set the first page to be a lower-most page and the last page to be an upper-most page, among all pages of the memory blocks configuring the super block, and begin performing the binary search process on the super block.

In step S704, the controller 130 may set a page arranged in the middle between the lower-most page and the upper-most page as a middle page. When the total number of pages between the lower-most page and the upper-most page is an even number, an upper page among the two pages closest to the true middle may be set as the middle page, but the present invention is not limited thereto. In another embodiment, the lower of such two pages may be set as the middle page.

In step S706, the controller 130 may control the memory device 150 to read the middle page in the super block.

In step S708, the controller 130 may determine whether the middle page is in an erase state or not.

If it is determined in the step S708 that the middle page is in the erase state ("YES" in step S708), the controller 130 may set the middle page as a new upper-most page in step S712. If it is determined in step S708 that the middle page is in a program state, that is, a state other than the erase state ("NO" in step S708), the controller 130 may set the middle page as a new lower-most page in step S710.

In step S714, the controller 130 may set a new middle page between the newly set upper-most and lower-most pages.

In step S716, the controller 130 may decide whether the new middle page is the same as either the new upper-most page or the new lower-most page.

If the new middle page is determined to be the same as either the new upper most page or the new lower-most page ("YES" in step S716), the controller 130 may set the new middle page as the first erase page in step S718.

If the new middle page is determined to be neither the new upper-most page nor the new lower-most page ("NO" in step S716), the controller 130 may repeat the processes of the steps S706 to S716 based on the new lower-most page, the new upper-most page, and the new middle page.

A process of detecting the first erase page will be described in the context in which an open memory block scanning is performed on a super block, configured as described herein, as an example.

Figure 8:
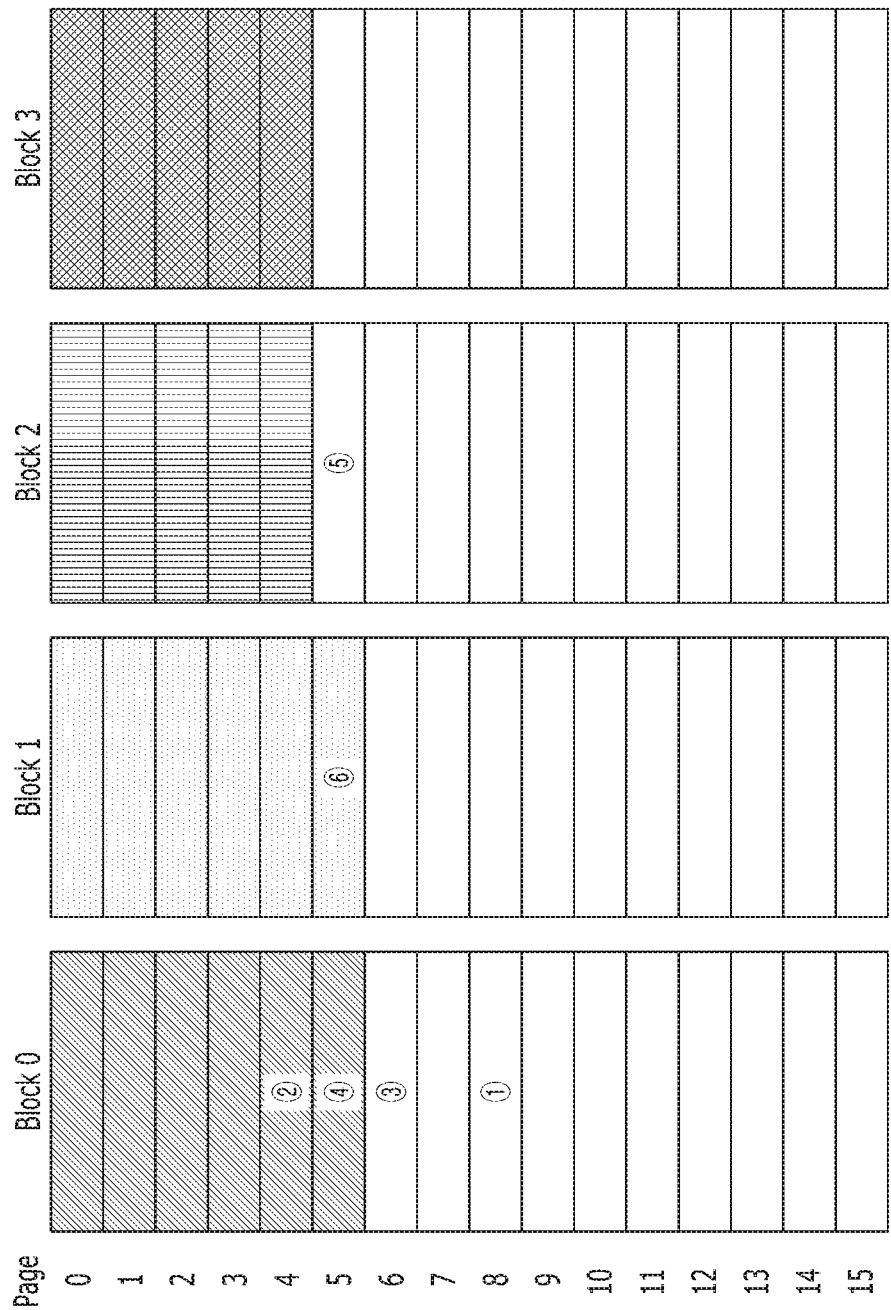
FIG. 8 illustrates a process of scanning an open memory block in accordance with an embodiment of the present invention.

FIG. 8 illustrates a process of scanning an open memory block in accordance with an embodiment of the present invention.

Referring to FIGS. 6 to 8, in step S702, the first page (Page 0) may be set as the lower-most page and the last page (Page 63) may be set as the upper-most page, among all the pages (Page 0 to Page 63) of the super memory block, which is considered as a single memory block.

Since (0+63)/2=31.5, Page 32 of FIG. 6 may be set as the middle page in step S704. Page 32 of FIG. 6 may correspond to Page 8 in Block 0 of FIG. 8. Each of these pages is denoted with the symbol ①. In step S706, the memory device 150 may read Page 32 (the middle page) under the control of the controller 130.

Since it is determined in the step S708 that Page 32 of FIG. 6 is in an erase state, the controller 130 may set Page 32 as a new upper-most page in the step S710. The new lower-most page may be Page 0.

In step S714, the new middle page may be Page 16 of FIG. 6. Page 16 of FIG. 6 may correspond to Page 4 in Block 0 illustrated in FIG. 8. As a result of the decision in step S716, the new middle page (Page 16) may not be the same as either the new upper-most page (Page 32) or the new lower-most page (Page 0). Therefore, the controller 130 may repeat the processes of the steps S706 to S716 based on the new upper-most page (Page 32), the new lower-most page (Page 0), and the new middle page (Page 16).

The encircled numbers ② to ⑤ illustrated in FIGS. 6 and 8 may correspond to the middle pages that the controller 130 sequentially sets during repetition of steps S706 to S716 the second to fifth times.

When the process of the step S706 is performed for the sixth time, the lower-most page is Page 20 of FIG. 6 (corresponding to Page 5 of Block 0 illustrated in FIG. 8), the upper-most page is Page 22 (corresponding to Page 5 of Block 2 illustrated in FIG. 8), and the middle page is Page 21 (corresponding to Page 5 of Block 1 illustrated in FIG. 8). The memory device 150 may read Page 5 of Block 1, which corresponds to Page 21 of FIG. 6, in response to the control of the controller 130. The encircled number (in FIGS. 6 and 8 may correspond to the middle page that the memory device 150 reads in the sixth iteration.

In step S708, since Page 5 of Block 1 (i.e., the middle page, Page 21) is in the program state, the controller 130 may set Page 21 as a new lower-most page in step S710. In step S714, the new lower-most page may be Page 21, the new upper-most page may be Page 22, and the new middle page may be Page 22.

In step S716, the upper-most page (Page 22) and the middle page (Page 22) may be determined to be the same. Accordingly, in step S718, the controller 130 may set Page 5 of Block 2 of FIG. 5, which corresponds to Page 22 of FIG. 6, as the first erase page of the super block, and end the open memory block scanning.

According to embodiments of the present invention, the controller 130 may perform the SPOR based on the first erase page (e.g., the middle page, Page 22) of the super block.

To be specific, the controller 130 may set four pages starting from Page 22 of FIG. 6, that is, Page 22 to Page 25, respectively corresponding to page 5 of Block 2, page 5 of Block 3, page 6 of Block 0 and page 6 of Block 1, as the first erase pages of the memory blocks in the super block in the programmed order according to an interleaving scheme.

According to embodiments of the present invention, the controller 130 may perform a dummy program operation on the first erase page of each of the memory blocks.

According to embodiments of the present invention, as described above, when a binary search is performed on a super block based on the order in which the pages in the super block are programmed as described with reference to FIG. 6, the first erase page of each of the memory blocks may be detected by performing the read operations only six times as shown in FIG. 8. The open memory block scanning of a super block including $2^M$ memory blocks, each including $2^N$ pages, may be completed only by performing read operations a total of N+M times. Therefore, as the number of read operations according to the open memory block scanning is reduced, the time required for the SPOR operation in the memory system 110 may be reduced, and the read disturbance caused by the read operation may be prevented.

Referring to FIGS. 9 to 17, a data processing system and electronic devices to which the memory system 110 including the memory device 150 and the controller 130 described with reference to FIGS. 1 to 8 may be applied are described in detail.

Figure 9:
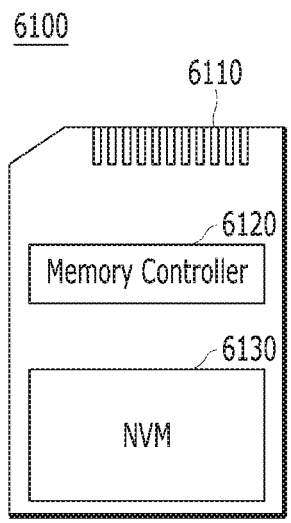
FIGS. 9 to 17 are diagrams schematically illustrating exemplary applications of the data processing system in accordance with various embodiments of the present invention.

FIG. 9 is a diagram schematically illustrating the data processing system including the memory system in accordance with an embodiment. FIG. 9 schematically illustrates a memory card system to which the memory system may be applied.

Referring to FIG. 9, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may be integrated to form a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and/or a universal flash storage (UFS).

Figure 10:
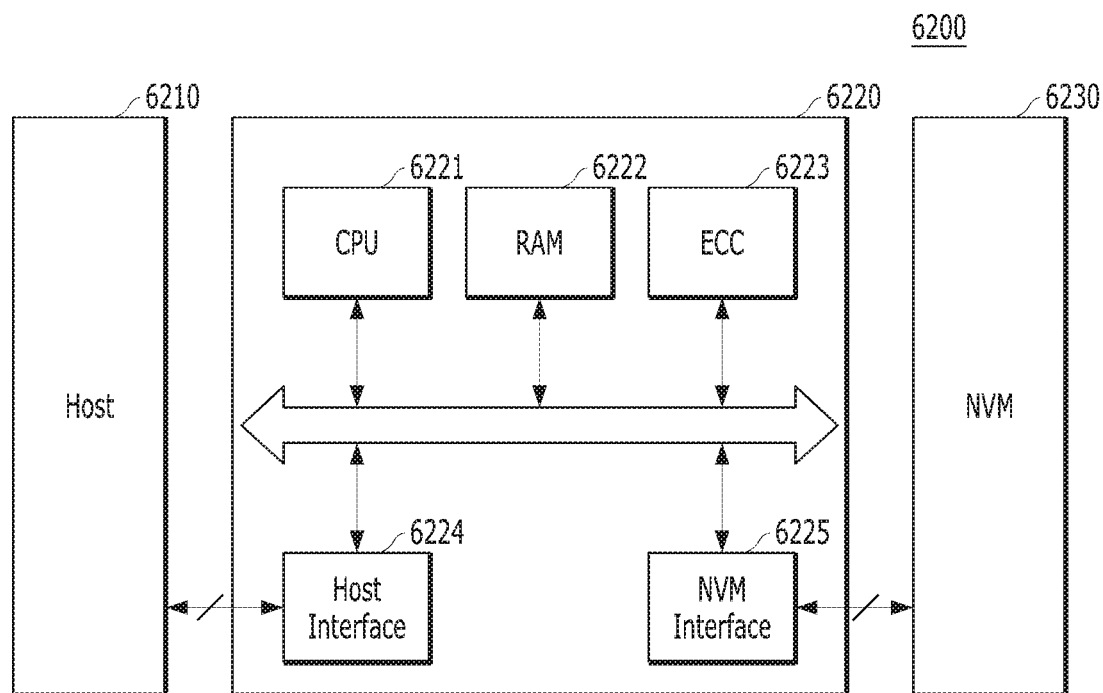

FIG. 10 is a diagram schematically illustrating another example of the data processing system including the memory system in accordance with an embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230, which usually operates at a low speed, to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system may be applied to wired/wireless electronic devices, particularly a mobile electronic device.

Figure 11:
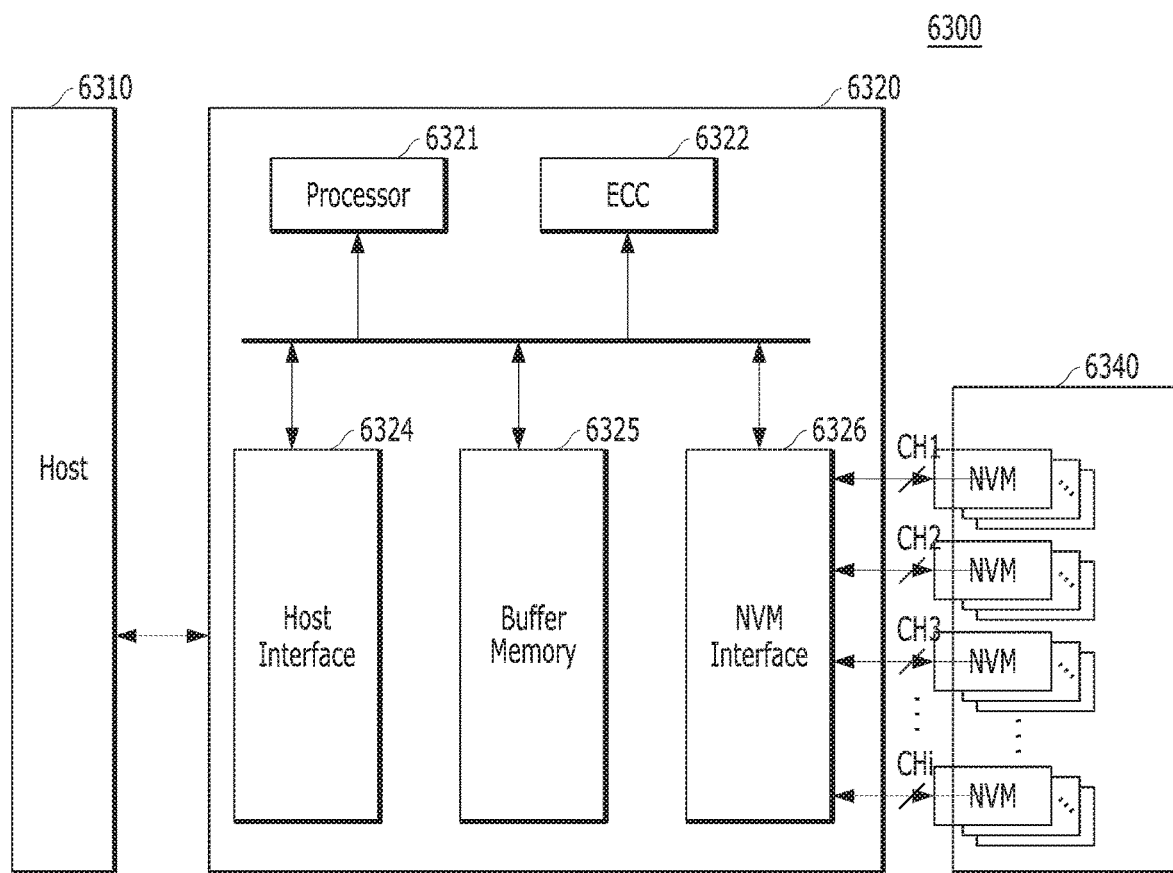

FIG. 11 is a diagram schematically illustrating another example of the data processing system including the memory system in accordance with an embodiment. FIG. 11 schematically illustrates an SSD to which the memory system may be applied.

Referring to FIG. 11, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. FIG. 11 illustrates that the buffer memory 6325 is disposed in the controller 6320. However, the buffer memory 6325 may be external the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
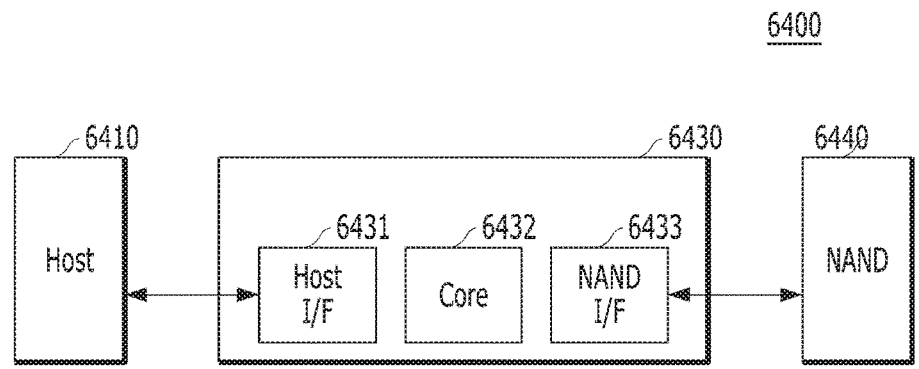

FIG. 12 is a diagram schematically illustrating another example of the data processing system including the memory system in accordance with an embodiment. FIG. 12 schematically illustrates an embedded Multi-Media Card (eMMC) to which the memory system may be applied.

Referring to FIG. 12, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with one or more embodiments. FIGS. 13 to 16 schematically illustrate UFS (Universal Flash Storage) systems to which the memory system may be applied.

Referring to FIGS. 13 to 16, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 9.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 13:
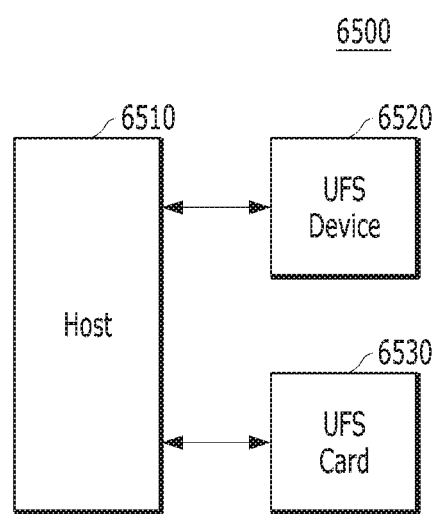

In the UFS system 6500 illustrated in FIG. 13, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. According to an embodiment, the configuration in which one UFS device 6520 and one UFS card 6530 are connected to the host 6510 is illustrated as an example. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 14:
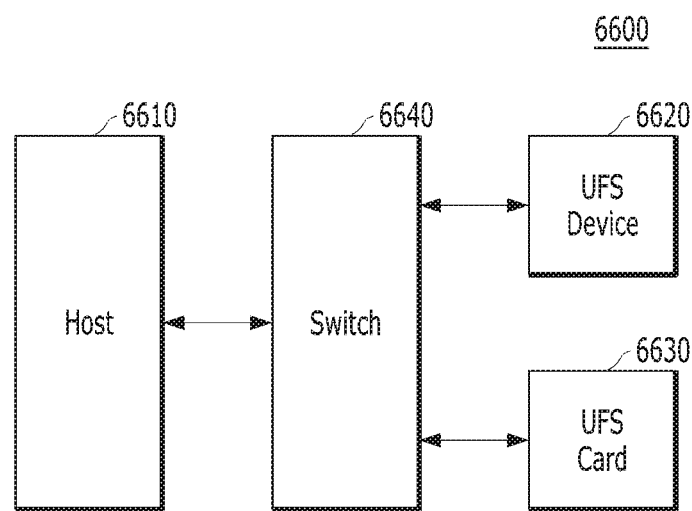

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. According to an embodiment, the configuration in which one UFS device 6620 and one UFS card 6630 are connected to the switching module 6640 is illustrated as an example. However, a plurality of UFS devices and UFS cards may be connected in parallel or in the form of a star to the switching module 6640, and a plurality of UFS cards may be connected in series or in the form of a chain to the UFS device 6620.

Figure 15:
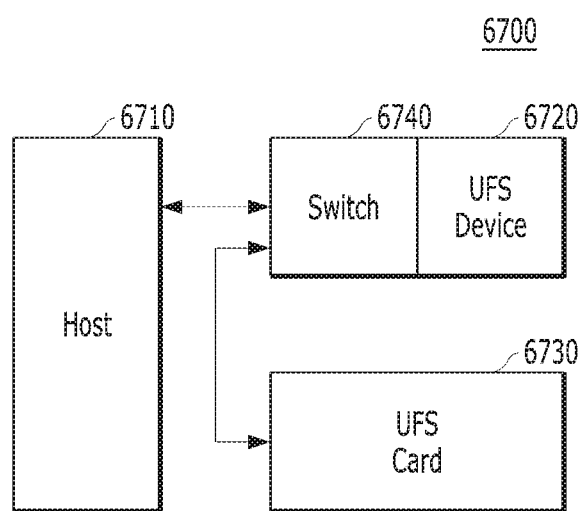

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. According to an embodiment, the configuration in which one UFS device 6720 and one UFS card 6730 are connected to the switching module 6740 is illustrated as an example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
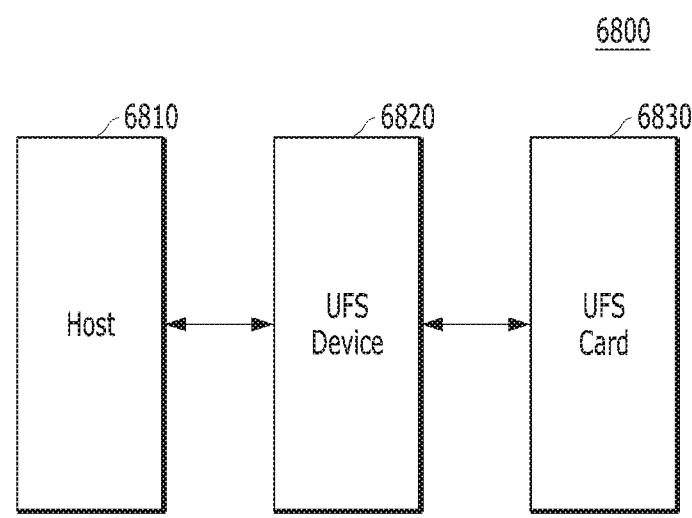

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. According to an embodiment, the configuration in which one UFS device 6820 is connected to the host 6810 and one UFS card 6830 is connected to the UFS device 6820 is illustrated as an example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
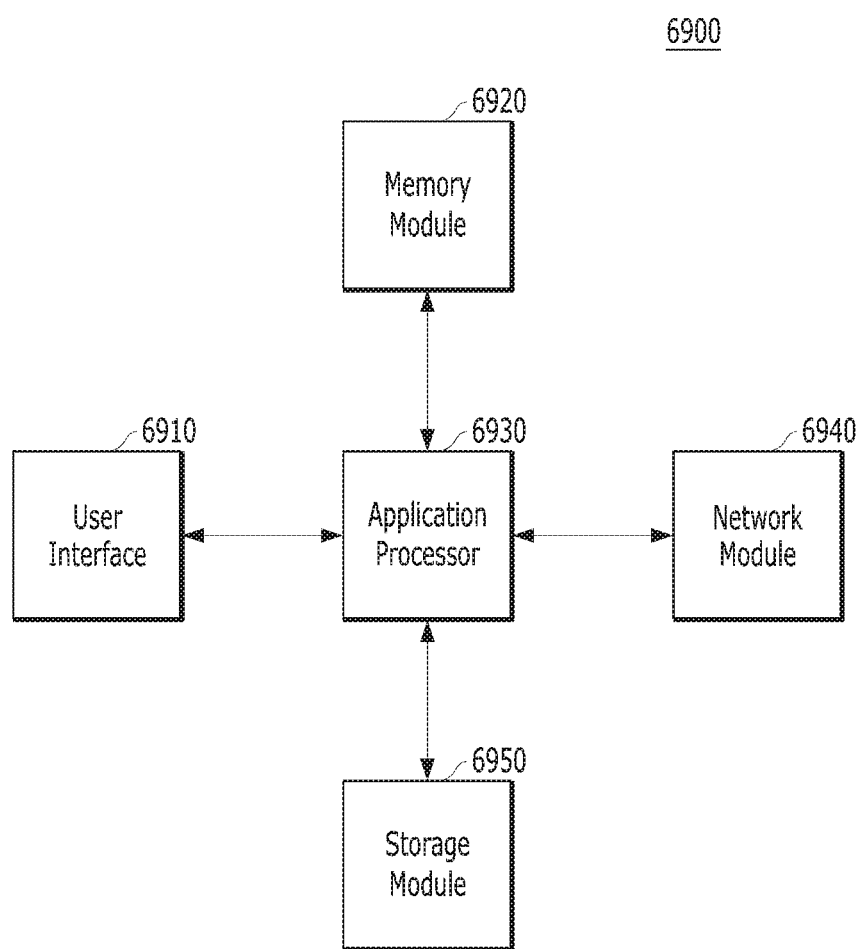

FIG. 17 is a diagram schematically illustrating another example of the data processing system including the memory system in accordance with an embodiment. FIG. 17 is a diagram schematically illustrating a user system to which the memory system may be applied.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, the performance of a memory system may be improved by quickly detecting a first erase page of an open memory block in the memory system.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A method for operating a memory system, the method comprising:

detecting a first erase page of a super block, which is formed of memory blocks, by scanning the super block according to a binary search scheme based on a program order in which pages in the super block are programmed; and performing a Sudden Power Off Recovery (SPOR) based on the detected first erase page.

2. The method of claim 1, wherein the program order is decided based on an interleaving scheme performed on the super block.

3. The method of claim 2, wherein the memory blocks of the super block are selected from memory dies of the memory system, such that at least one of the memory blocks is selected from each of the memory dies.

4. The method of claim 1, wherein the performing of the SPOR based on the first erase page includes programming the pages with dummy data in the program order starting from the detected first erase page.

5. The method of claim 1, wherein the detecting of the first erase page of the super block by scanning the super block in the binary search scheme includes:

setting a middle page based on a lower-most page and an upper-most page in the program order;

setting a new lower-most page, a new upper-most page, and a new middle page according to whether the middle page is in an erase state or not; and setting the new middle page as the first erase page when the new middle page is the same as at least one of the new lower-most page and the new upper-most page.

6. A memory system, comprising:

a memory device; and a controller suitable for controlling the memory device, wherein the controller detects a first erase page of a super block, which is formed of memory blocks, by scanning the super block according to a binary search scheme based on a program order in which pages in the super block are programmed, and performs a Sudden Power Off Recovery (SPOR) based on the detected first erase page.

7. The memory system of claim 6, wherein the program order is decided based on an interleaving scheme performed on the super block.

8. The memory system of claim 7, wherein the memory blocks of the super block are selected from memory dies of the memory system, such that at least one of the memory blocks is selected from each of the memory dies.

9. The memory system of claim 6, wherein the controller performs the SPOR by programming the pages with dummy data in the program order starting from the detected first erase page.

10. The memory system of claim 6, wherein, in detecting the first erase page of the super block, the controller sets a middle page based on a lower-most page and an upper-most page in the program order;

sets a new lower-most page, a new upper-most page, and a new middle page according to whether the middle page is in an erase state or not; and sets the new middle page as the first erase page when the new middle page is the same as at least one of the new lower-most page and the new upper-most page.

11. A memory system comprising:

a memory device including a super block having two or more memory blocks each configured by pages; and a controller configured to:

control the memory device to perform a program operation to the super block according to an interleaved program order of the pages among the memory blocks;

detect a global first erased page among the pages according to a linear search scheme for the interleaved program order;

detect, based on the global first erased page, local first erased pages of the respective memory blocks according to the interleaved program order; and control the memory device to perform a sudden power off recovery operation to the memory blocks according to the interleaved program order and the local first erased pages.

* * * * *